(12) United States Patent
Song

(10) Patent No.: US 8,876,299 B2
(45) Date of Patent: *Nov. 4, 2014

(54) ELECTRONIC DEVICE

(75) Inventor: Qing Song, Tokyo (JP)

(73) Assignee: NEC Display Solutions, Ltd., Tokyo (JP)

( * ) Notice: Subject to any disclaimer, the term of this patent is extended or adjusted under 35 U.S.C. 154(b) by 370 days.

This patent is subject to a terminal disclaimer.

(21) Appl. No.: 13/386,261

(22) PCT Filed: Jul. 21, 2009

(86) PCT No.: PCT/JP2009/063025
§ 371 (c)(1),
(2), (4) Date: Jan. 20, 2012

(87) PCT Pub. No.: WO2011/010354
PCT Pub. Date: Jan. 27, 2011

(65) Prior Publication Data
US 2012/0120575 A1    May 17, 2012

(51) Int. Cl.
*G03B 21/14* (2006.01)
*H05K 5/02* (2006.01)
*F16M 11/10* (2006.01)

(52) U.S. Cl.
CPC .............. *G03B 21/14* (2013.01); *H05K 5/0234* (2013.01); *F16M 11/10* (2013.01)
USPC .......................................................... 353/70

(58) Field of Classification Search
CPC ........ G03B 21/14; G03B 21/145; F16M 7/00; F16M 7/08; F16M 2200/08; A47B 91/024
USPC ................ 353/70; 411/999; 248/188.4, 188.8
See application file for complete search history.

(56) References Cited

U.S. PATENT DOCUMENTS

| 5,382,752 A | * | 1/1995 | Reyhan et al. .................. 174/50 |
| 5,951,136 A |   | 9/1999 | Furuhata et al. |

(Continued)

FOREIGN PATENT DOCUMENTS

| CN | 1658062 A | 8/2005 |
| CN | 1680745 A | 10/2005 |

(Continued)

OTHER PUBLICATIONS

International Search Report in PCT/JP2009/063025 dated Sep. 8, 2009 (English Translation Thereof).

(Continued)

*Primary Examiner* — Thanh Luu
*Assistant Examiner* — Danell L Owens
(74) *Attorney, Agent, or Firm* — McGinn IP Law Group, PLLC

(57) ABSTRACT

An electronic device of the present application includes a case (1), a stem-shaped leg (3), and a leg fixing part (4). The leg fixing part (4) is provided on one face of the case (1) and includes a case thread ridge portion (4a) that is formed on an inside face of a hole, into which the leg (3) is inserted, and that is divided into isolated thread ridge portions. A peripheral face of a stem portion of the leg (3) has a first screw structure portion (3a), which is engaged with the case thread ridge portion (4a), and a second screw structure portion (3b) which is engaged with the case thread ridge portion (4a) before being engaged with the first screw structure portion (3a). The second screw structure portion (3b) has a guide portion (5a) and an idle turn inducing portion (5b). The guide portion (5a) guides the case thread ridge portion (4a) to the second screw structure portion (3b) when the leg (3) is inserted into the hole while being turned in a direction in which the leg (3) enters the case (1). The idle turn inducing portion (5b) causes the second screw structure portion (3b) to turn idly with respect to the case thread ridge portion (4a) when the leg (3) is turned in a direction in which the leg (3) is taken out of the case (1).

6 Claims, 6 Drawing Sheets

(56) References Cited

U.S. PATENT DOCUMENTS

| | | |
|---|---|---|
| 6,203,158 B1 | 3/2001 | Furuhata et al. |
| 6,302,543 B1 | 10/2001 | Arai et al. |
| 6,364,492 B1 | 4/2002 | Fujimori et al. |
| RE38,006 E | 2/2003 | Furuhata et al. |
| 7,198,238 B2 | 4/2007 | Inoue |
| 7,535,721 B2 | 5/2009 | Okoshi et al. |
| 8,675,362 B2 * | 3/2014 | Ogawa .................. 361/679.59 |
| 2002/0021415 A1 | 2/2002 | Fujimori et al. |
| 2005/0185386 A1 | 8/2005 | Okoshi et al. |

FOREIGN PATENT DOCUMENTS

| | | | |
|---|---|---|---|
| JP | 60-85881 U | | 6/1985 |
| JP | 2000-138467 A | | 5/2000 |
| JP | 2000138467 A | * | 5/2000 |
| JP | 2003-35028 A | | 2/2003 |
| JP | 2004-042947 A | | 2/2004 |
| JP | 2005-234307 A | | 9/2005 |
| JP | 2005-337430 A | | 12/2005 |
| JP | 2008-242159 A | | 10/2008 |
| JP | 2008-275932 A | | 11/2008 |
| WO | WO 98/12601 A1 | | 3/1998 |

OTHER PUBLICATIONS

Japanese Office Action dated Dec. 4, 2012 with English translation.
Chinese Office Action dated Feb. 8, 2014, with English translation.

* cited by examiner

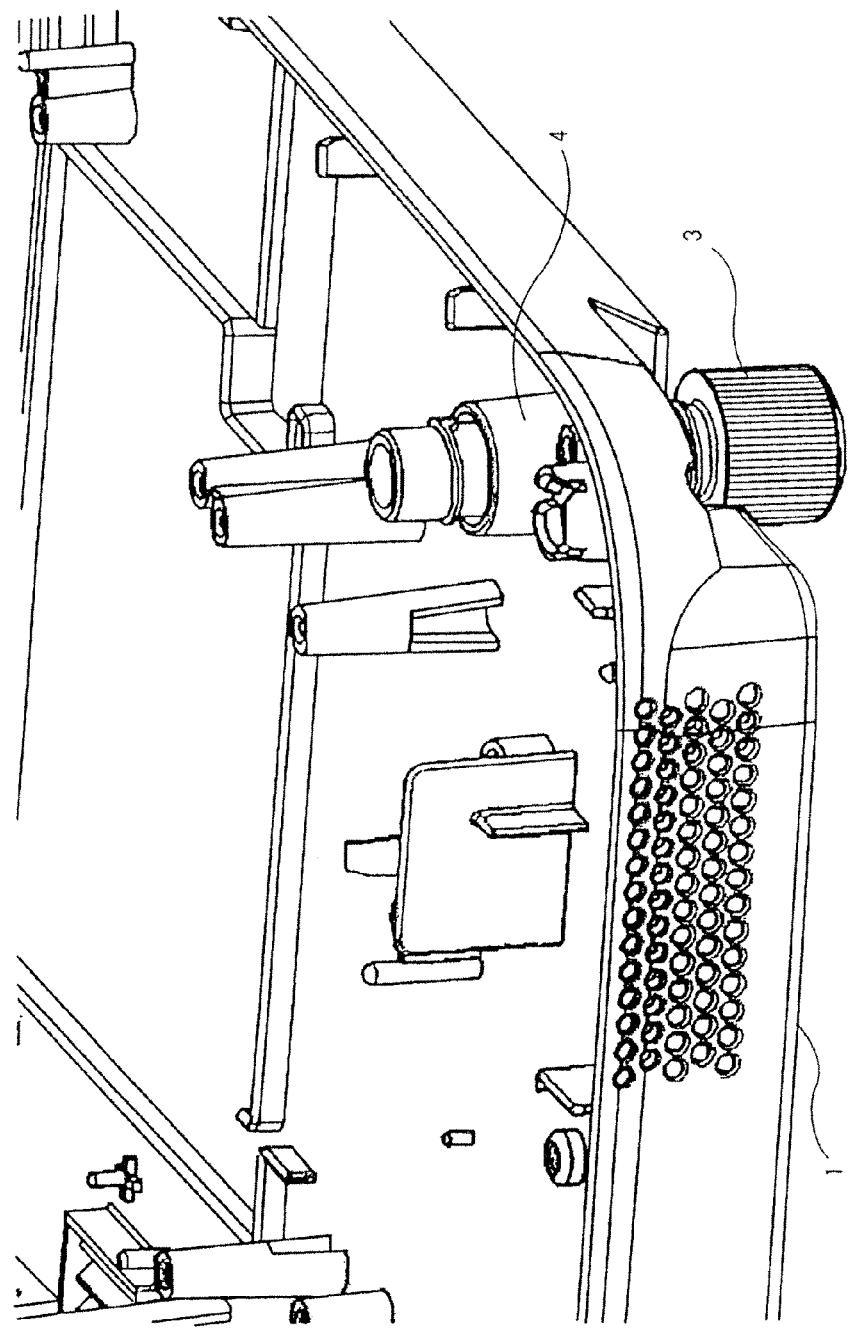

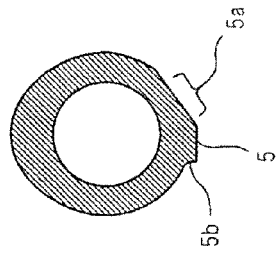
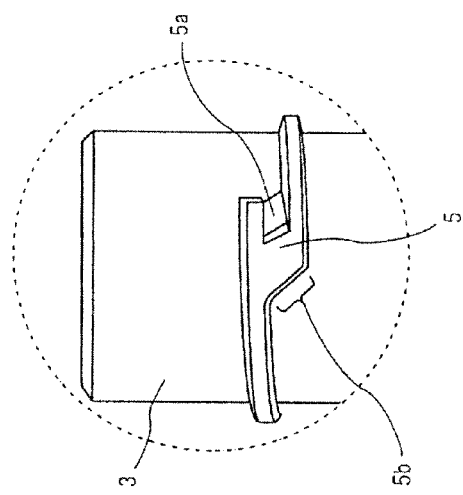
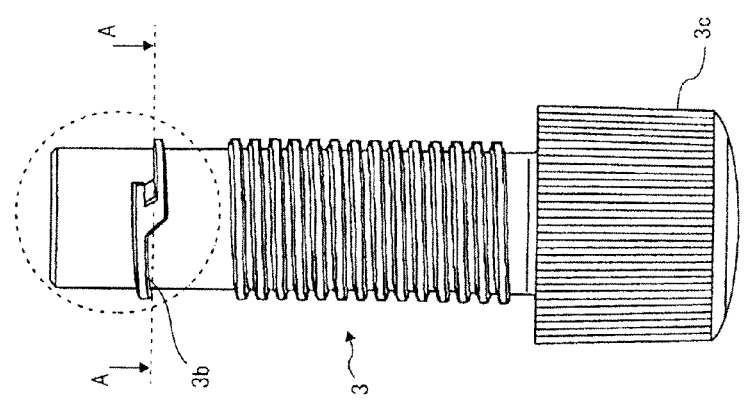

ELECTRONIC DEVICE

TECHNICAL FIELD

The present invention relates to a mechanism of a leg part for adjusting the inclination and the height of an electronic device with respect to a setting plane.

BACKGROUND ART

An electronic device is provided with a mechanism for easily adjusting its height and inclination. For example, as disclosed in a patent document 1 (Japanese Unexamined Patent Publication No. 2005-234307), there is proposed a screw structure by which the leg of the device main body is caused to extend or to contract.

However, this type of structure, has the following problem: when the leg is extended, if the leg is extended to a position where the screw portion of leg becomes detached from the device main body, the leg will drop out of the device. Thus, it is proposed to provide a root portion of the leg with a retaining structure which is larger than the outer diameter of the leg so as to prevent the leg from easily being dropped. However, this retaining structure creates a problem in which the number of operations in the assembly process will be increased when the leg is fixed to the main body of the electronic device.

PRIOR ART LITERATURE

Patent Document

Patent document 1: Japanese laid open Patent Application No. 2005-234307

SUMMARY OF THE INVENTION

An object of the present is to provide an electronic device having a leg part capable of solving the problem in the background art described above. One example of the object is to provide a leg, that can be mounted in the main body of an electronic device and that has a structure to prevent the leg from being dropped and that can be extended and retracted, and an electronic device which has this kind of leg.

An electronic device according to one embodiment of the present invention includes a case, a stem-shaped leg, and a leg fixing part. The leg fixing part is a hole, which is formed in one face of the case and into which the leg is inserted, and is a part which includes a case thread ridge portion formed on an inside face of the hole.

A peripheral face of a stem portion of the leg has a first screw structure portion, which is made of a plurality of laps of continuous thread ridge that can be engaged with the case thread ridge portion, and a second screw structure portion, which is made of a thread ridge at the same screw pitch as the first screw structure portion and which is engaged with the case thread ridge portion before which is engaged with the first screw structure portion when the leg is inserted into the hole.

Further, the case thread ridge portion is divided into isolated portions, and the second screw structure portion has a guide portion and an idle turn inducing portion.

The guide portion guides the case thread ridge portion to the second screw structure portion in such a way that the second screw structure portion passes through the case thread ridge portion when the leg is inserted into the hole while it is turned in a direction in which the leg enters the case. Further, the idle turn inducing portion turns the second screw structure portion idly with respect to the case thread ridge portion in such a way that the second screw structure portion does not pass through the case thread ridge portion when the leg is turned in a direction in which the leg is taken out of the case.

BRIEF DESCRIPTION OF THE DRAWINGS

FIG. 2 is a perspective view to illustrate a state where the leg according to the one embodiment of the present invention is fixed to the display device with a main body of the display device (referred to as a device main body) exploded.

FIG. 4(a) is a side view of the leg according to the one embodiment of the present invention, and FIG. 4(b) is a partial enlarged view of the leg shown in FIG. 4(a), and FIG. 4(c) is a section view along line A-A in FIG. 4(a).

FIG. 4 is fixed is located.

FIG. 4 is fixed is located.

MODE FOR CARRYING OUT THE INVENTION

Hereinafter, an embodiment of the present invention will be described with reference to the drawings. Here, by taking a projection type display device as an example, the embodiment of the present invention will be described in detail. However, the present invention can be applied to any electronic device that needs to have its height adjusted with respect to a setting plane, and is not limited in application to the projection type display device.

Figure 1A:
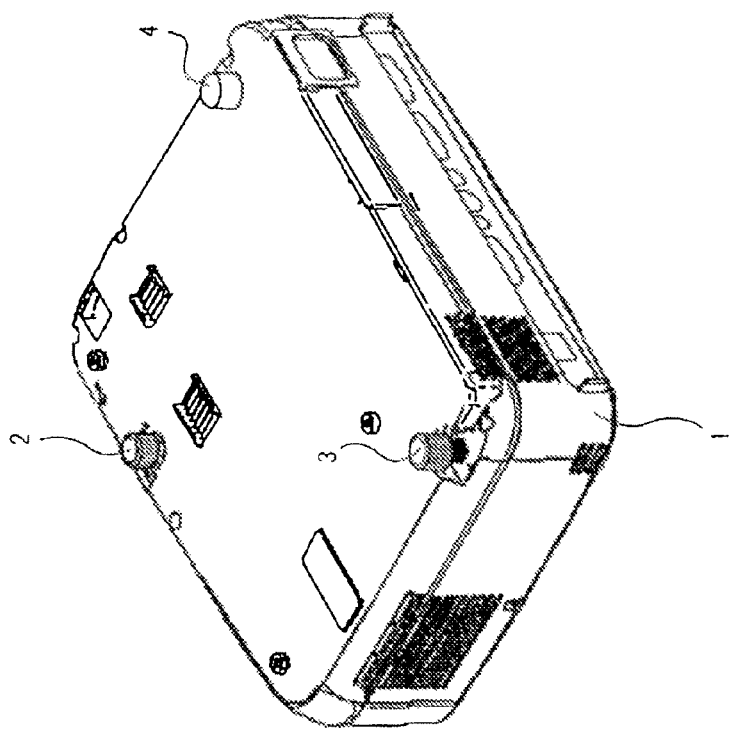
FIG. 1(a) is a perspective view, when viewed from a top face, of a projection type display device having a leg according to one embodiment of the present invention.
Figure 1B:
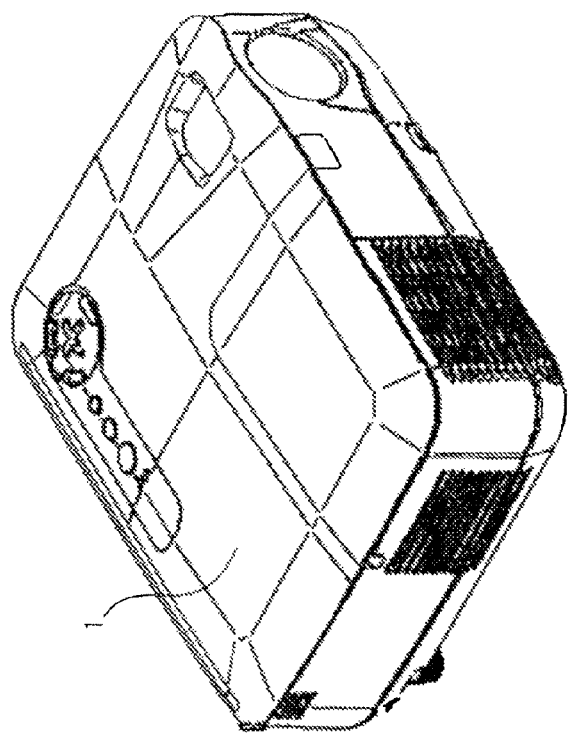
FIG. 1(b) is a perspective view, when viewed from a bottom face, of the display device.

FIG. 1 shows a projection type display device having a leg according to one embodiment of the present invention. FIG. 1(a) is a perspective view when viewed from a top face side of the device, and FIG. 1(b) is a perspective view when viewed from a bottom face side of the device. The device has one leg in a front portion of the bottom face of a device main body (case) 1 and two legs in a rear portion thereof, that is, three legs 2, 3, and 4 in total. Leg 2 in the front portion and leg 3 of one of the legs in the rear portion can have their heights adjusted. A user can adjust the height and the inclination of the projection type display device with respect to the setting plane by using legs 2, 3 like this.

Next, leg 3 according to the present invention and a case structure to which leg 3 is fixed will be described in detail.

Figure 3:
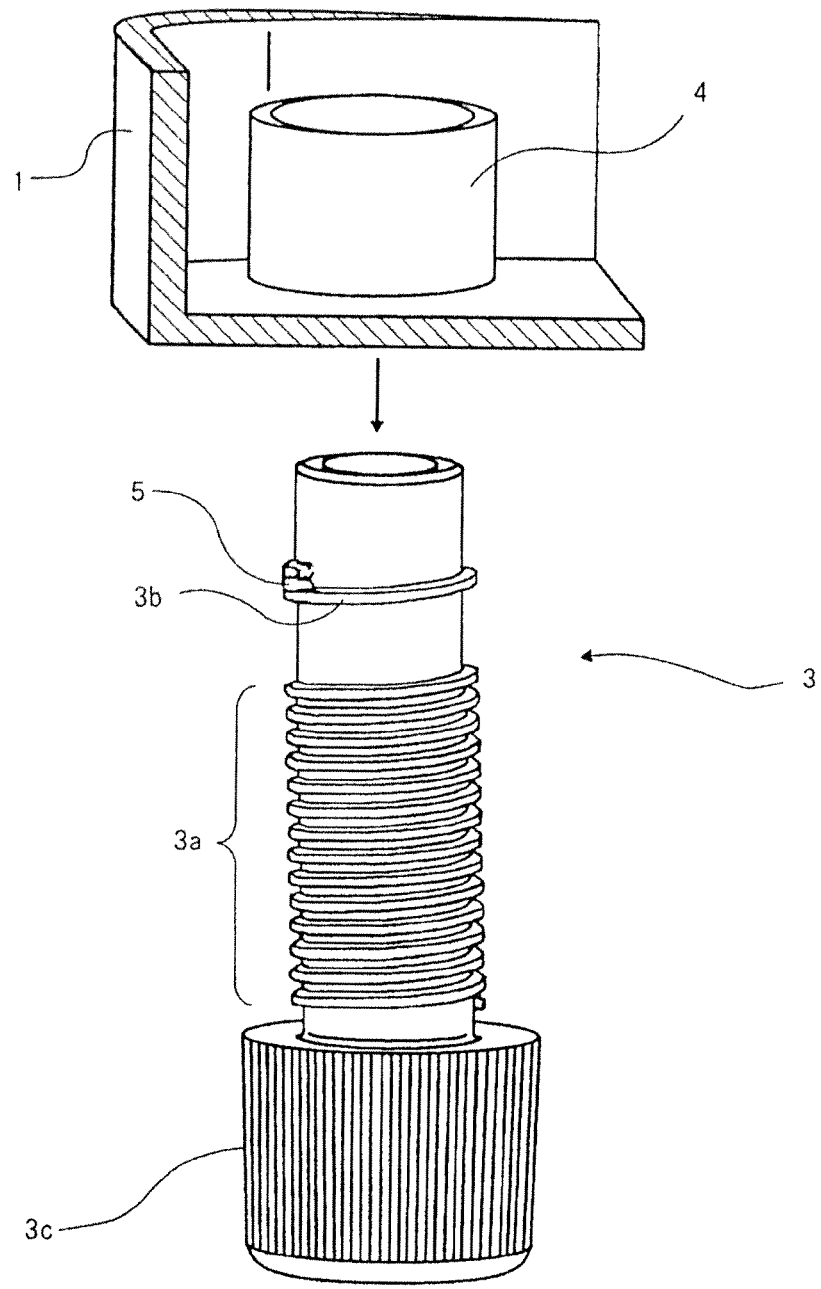
FIG. 3 is a view to illustrate a state in which the leg according to the one embodiment of the present invention is fixed to the device main body.

FIG. 2 is a perspective view to illustrate a state in which leg 3 is fixed to device main body 1 with device main body 1 exploded. FIG. 3 is an assembly view of leg 3. Here, FIG. 3 does not show the whole of device main body 1 but shows only a leg fixing part 4 to which leg 3 is fixed.

Leg 3 has first screw structure portion 3a and second screw structure portion 3b provided at a stem portion of leg 3. First screw structure portion 3a is located closer to a setting plane side of device main body 1 than second screw structure portion 3b in a state where leg 3 is mounted in device main body 1. An end portion of leg 3 that is on the setting plane side of device main body 1 is operating portion 3c that is held by a person who mounts leg 3 in device main body 1.

A plurality of laps of general thread ridge are made on the peripheral surface of the stem portion of first screw structure portion 3a. As is the usual case, first screw structure portion 3a functions as an operating portion by which leg 3 is extended or retracted (moved up or down) from device main body 1. Second screw structure portion 3b is provided at a position separate from first screw structure portion 3a. This second screw structure portion 3b functions as a portion for preventing leg 3 from being dropped.

Second screw structure portion 3b is generally constructed of a single lap of thread ridge, and the overlapping portions of the thread ridge are coupled to each other by coupling portion 5 at the start point and the end point of the thread ridge. Further, the screw pitch of first screw structure portion 3a is the same as the screw pitch of second screw structure portion 3b, and both first screw structure portion 3a and second screw structure portion 3b are also the same in the direction in which the thread ridge is rounded.

In FIG. 4 is shown a specific construction of leg 3. FIG. 4(a) is a side view of leg 3, and FIG. 4(b) is an enlarged view of a portion encircled by a single dot and dash line in FIG. 4(a), and FIG. 4(c) is a section view along a line A-A in FIG. 4(a). As shown in these drawings, on coupling portion 5 of second screw structure portion 3b are formed guide portion 5a and reverse turn & breakage preventing portion 5b.

Guide portion 5a is located on a front side in a direction in which leg 3 is turned when leg 3 is mounted in device main body 1. Guide portion 5a is constructed of a face inclined to the outside face of coupling portion 5 from a peripheral face of the stem portion of leg 3.

Reverse turn & breakage preventing portion 5b is located on a side opposite to guide portion 5a. Reverse turn & breakage preventing portion 5b is constructed of a vertical face with respect to the radial direction of the stem portion of leg 3. This vertical face is inclined in a peripheral direction (in the right direction in FIG. 4(b)) of the stem portion of leg 3 with respect to the direction in which the stem portion of leg 3 is extended.

Figure 5A:
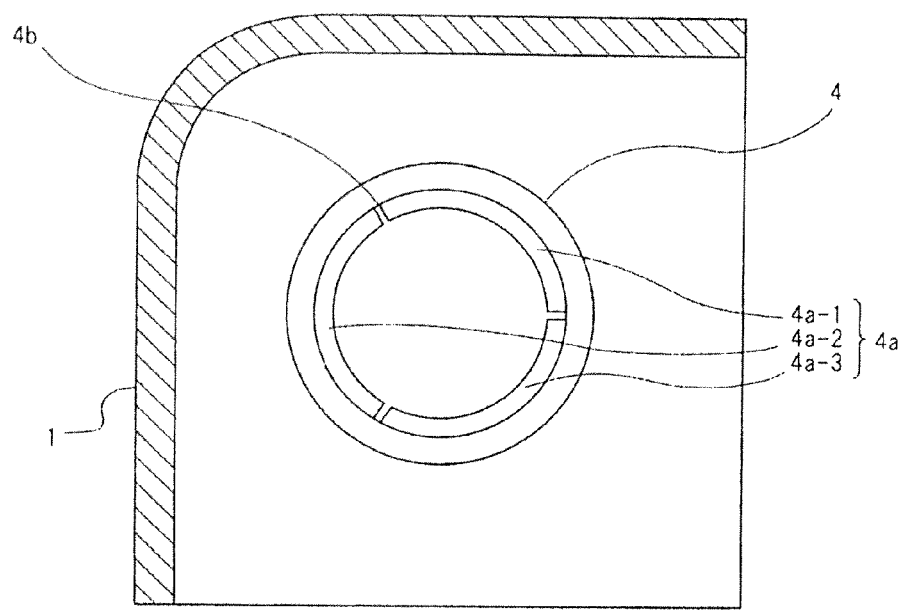
FIG. 5(a) is a plan view to show an inside face of a case in which a leg fixing part to which the leg shown in FIG. 3
Figure 5B:
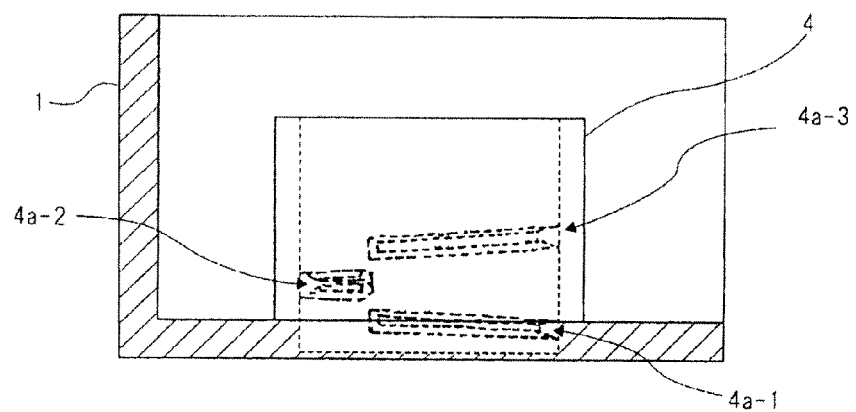
FIG. 5(b) is a perspective view, when viewed from a side, of a portion in which the leg fixing part of the case main body is located.

FIG. 5 shows the structure of a leg fixing part 4 to which leg 3 is fixed. FIG. 4(a) is a top view to show the inside face of device main body 1 in which leg fixing part 4 is arranged, and FIG. 4(b) is a longitudinal section view of a portion in which leg fixing part 4 of device main body 1 is located.

Leg fixing part 4 shaped like a cylinder is provided on the inside face of device main body (case) 1. On the inside face of its hole that is shaped like a cylinder is provided case thread ridge portion 4a having the same screw pitch as the screw structure portions 3a, 3b of leg 3. Screw structure portions 3a, 3b and the case thread ridge portion 4a are constructed in such a way that when leg 3 is turned clockwise, screw structure portions 3a, 3b and case thread ridge portion 4a are engaged with each other, whereby leg 3 is made to travel into device main body 1 and that when leg 3 is turned counterclockwise, leg 3 is caused to travel out to the outside of device main body 1.

Case thread ridge portion 4a is a thread ridge having at least three pitches (three stages) of thread ridges and is constructed of three thread ridge portions. In other words, case thread ridge portion 4a has first thread ridge portion 4a-1, second thread ridge portion 4a-2, and a third thread ridge portion 4a-3 for each one lap of three laps (three screw pitches) of the thread ridge. Further, case thread ridge portion 4a is constructed in such a way that when the interior of the hole of leg fixing part 4 is viewed from the bottom face of device main body 1, first thread ridge portion 4a-1, second thread ridge portion 4a-2, and third thread ridge portion 4a-3 do not overlap each other (see FIG. 5(a)). For this reason, each of first thread ridge portion 4a-1, second thread ridge portion 4a-2, and third thread ridge portion 4a-3 is constructed of a thread ridge portion corresponding to a portion that is smaller than one portion when a single lap of thread ridge is divided into three equal portions. More preferably, the case thread ridge portion 4a is constructed in such a way that when leg fixing part 4 is viewed from the bottom face of device main body 1, gap 4b is formed between respective thread ridge portions 4a-1, 4a-2, and 4a-3.

In this way, the present invention employs a construction such that the plurality of thread ridges are isolated from each other, so that a mold structure can be made simpler than in the case where a thread ridge is continuously formed. The employment of this construction can eliminate, for example, the need for employing a sliding mechanism for the mold. Thus, when a device main body of an electronic device is manufactured by the use of a mold, the device main body can be manufactured at a lower cost.

Next, an operation of mounting leg 3 to device main body 1 will be described.

When a user inserts leg 3 straight into the hole of leg fixing part 4, second screw structure portion 3b butts up against case thread ridge portion 4a provided in leg fixing part 4 and hence cannot be inserted into the hole of leg fixing part 4.

Thus, when the user holds an operation portion 3c of leg 3 with his/her hands and inserts leg 3 inside leg fixing part 4 while turning leg 3, second screw structure portion 3b is engaged with case thread ridge portion 4a, whereby leg 3 can be inserted. Specifically, first, when leg 3 is turned clockwise, guide portion 5a (see FIGS. 4(b) and 4(c)) of coupling portion 5 of second screw structure portion 3b that is formed on leg 3 butts up against first thread ridge portion 4a-1 of case thread ridge portion 4a.

Then, when leg 3 is further turned, first thread ridge portion 4a-1 climbs up guide portion 5a and further climbs over coupling portion 5 because, as shown in FIG. 4(b), guide portion 5a is inclined to the outside face of coupling portion 5 from the peripheral face of the stem portion of leg 3.

Figure 6A:
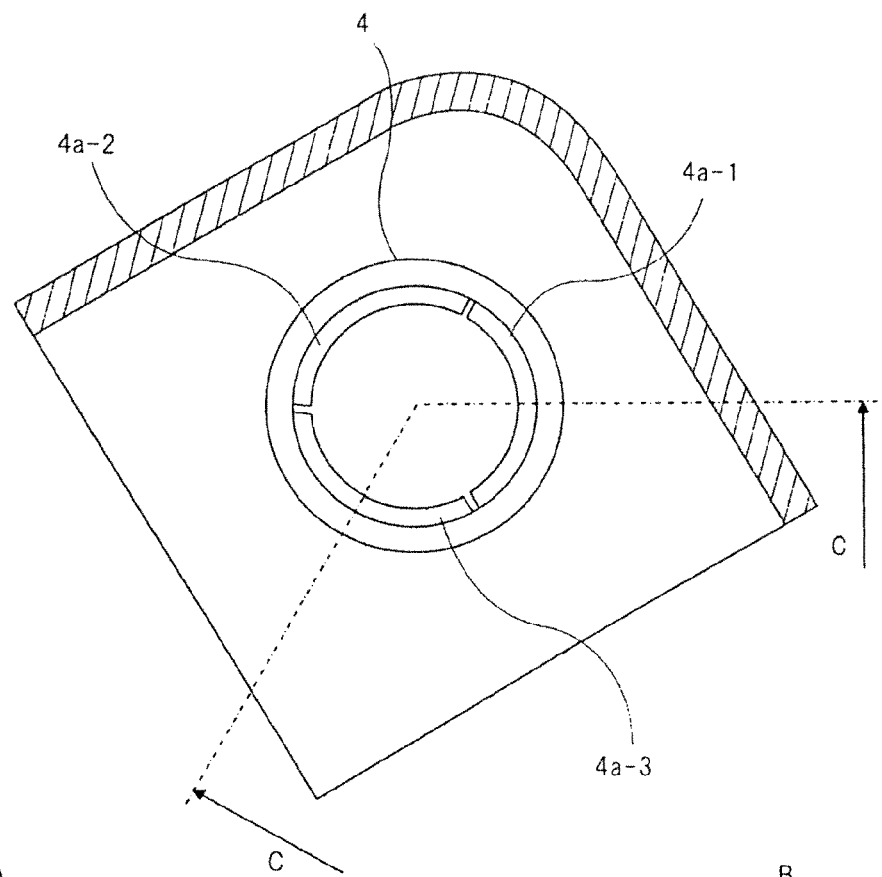
FIG. 6(a) is a plan view to show the inside face of the case in which the leg fixing part to which the leg shown in FIG. 3
Figure 6B:
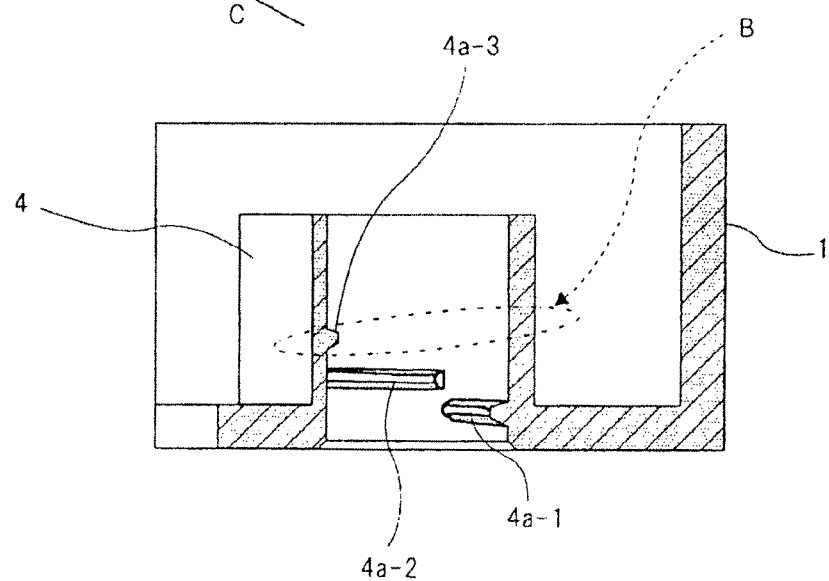
FIG. 6(b) is a section view along line C-C in FIG. 4(a).

Respective thread ridge portions 4a-1, 4a-2, and 4a-3 are formed separately from each other for each lap of three laps (three pitches) of the thread ridge and are arranged in such a way that they do not overlap each other when viewed from the direction in which the hole of leg fixing part 4 is formed. As a result, as shown in a region (encircled by a single dot and dash line) B in FIG. 6(b), a thread ridge portion is not formed on a side opposite to isolated third thread ridge portion 4a-3. For this reason, when leg 3 is inserted while being turned, leg 3 can be inclined. Since leg 3 can be inclined, as described above, coupling portion 5 can be made to easily climb over first thread ridge portion 4a-1, so that leg 3 can be inserted.

When second screw structure portion 3b passes through first thread ridge portion 4a-1, guide portion 5a of coupling portion 5 of the second screw structure portion 3b butts up against second thread ridge portion 4a-2. Also in this case, as is the case described above, coupling portion 5 of second screw structure portion 3b passes through second thread ridge portion 4a-2. When leg 3 is further turned, coupling portion 5 of second screw structure portion 3b passes through third thread ridge portion 4a-3.

In this way, second screw structure portion 3b completely passes through case thread ridge portion 4a inside leg fixing part 4. When leg 3 is further turned and pressed in, the first screw structure portion 3a is engaged with case thread ridge portion 4a and passes through case thread ridge portion 4a, whereby leg 3 is stored in device main body 1.

Further, when leg 3 that is stored in device main body 1 is turned counterclockwise, leg 3 can be taken out of device main body 1. According to the construction described above, the extension and retraction (the adjustment of the length) of leg 3 can be realized.

When first screw structure portion 3a is fully removed from device main body 1 in the process in which leg 3 is extended, case thread ridge portion 4a of leg fixing part 4 is located between first screw structure portion 3a and second screw structure portion 3b.

In this state, second screw structure portion 3b is received by case thread ridge portion 4a, so that leg 3 can be prevented from being dropped. Further, even if the user turns leg 3 counterclockwise so as to take out leg 3, the state where leg 3 is taken out is hardly changed. When leg 3 is turned counterclockwise, reverse turn & breakage preventing portion 5b of coupling portion 5 of leg 3 butts up against case thread ridge portion 4a, so that second screw structure portion 3b cannot travel further in the direction in which leg 3 is taken out.

In other words, as shown in FIG. 4(b), reverse turn & breakage preventing portion 5b is constructed of a vertical face with respect to the radial direction of the stern portion of leg 3 and this vertical face is inclined in the peripheral direction (right direction in FIG. 4(b)) of the stem portion of leg 3 with respect to a direction in which the stem portion of leg 3 is extended. For this reason, even if leg 3 is turned counterclockwise, reverse turn & breakage preventing portion 5b is not stopped at case thread ridge portion 4a but is moved along case thread ridge portion 4a as is. Thus, case thread ridge portion 4a does not climb over coupling portion 5 of second screw structure portion 3b. As a result, leg 3 is idly turned at the same position. Reverse turn & breakage preventing portion 5b is also an idle turn inducing portion of leg 3.

Because leg 3 is turned at the same place, even if leg 3 is operated by a turning force more than required, leg 3 and leg fixing part 4 does not have a force applied thereto, so that leg 3 and leg fixing part 4 can be prevented from being broken. In this regard, in the case where leg 3 is completely removed from device main body 1, by turning leg 3 with leg 3 inclined, leg 3 can be completely removed from device main body 1.

According to the construction of the present invention as described above, leg 3 can be mounted in the main body of the electronic device with ease like a screw. When leg 3 that is mounted in the main body of the electronic device is turned and extended, second screw structure portion 3b is caught on case thread ridge portion 4a and is idly turned at that position, so that leg 3 cannot be taken out any more. Thus, leg 3 can be prevented from being dropped.

Up to this point, the present invention has been described with reference to the embodiment, but the present invention is not limited to the exemplary embodiment described above. Various modifications that can be understood by a person skilled in the art can be made to the configuration or the detail of the present invention within the scope of the present invention.

DESCRIPTION OF REFERENCE NUMERALS AND SIGNS 1 device main body
2, 3 leg
3a first screw structure portion
3b second screw structure portion
4 leg fixing part
4a-1 first thread ridge portion
4a-2 second thread ridge portion
4a-3 third thread ridge portion
5 coupling portion
5a guide portion
5b idle turn inducing portion

The invention claimed is:

1. An electronic device comprising:
a case;
a stern-shaped leg; and
a leg fixing part that is a hole, which is formed in one face of the case and into which the leg is inserted, and that includes a case thread ridge portion formed on an inside face of the hole;
wherein a peripheral face of a stem portion of the leg has a first screw structure portion, which includes a plurality of laps of continuous thread ridge that can be engaged with the case thread ridge portion, and a second screw structure portion, which includes a thread ridge at a same screw pitch as the first screw structure portion and which is engaged with the case thread ridge portion before being engaged with the first screw structure portion when the leg is inserted into the hole,
wherein the case thread ridge portion is divided into isolated portions, and
wherein the second screw structure portion has:
a guide portion for guiding the case thread ridge portion to the second screw structure portion in such a way that the second screw structure portion passes through the case thread ridge portion when the leg is inserted into the hole while being turned in a direction in which the leg enters the case; and
an idle turn inducing portion for turning the second screw structure portion idly with respect to the case thread ridge portion in such a way that the second screw structure portion does not pass through the case thread ridge portion when the leg is turned in a direction in which the leg is taken out of the case.

2. The electronic device as claimed in claim 1,
wherein the second screw structure portion has a single lap of thread ridge and a coupling portion for coupling a start point to an end point of the single lap of the thread ridge,
wherein the guide portion is provided on one face, which is on a front side in a direction in which the leg is inserted and turned, of both end faces of the coupling portion related to a peripheral direction of the stem portion of the leg and is inclined to an outside face of the coupling portion from a peripheral face of the stem portion of the leg, and
wherein the idle turn inducing portion is provided on a side opposite to the one face of the coupling portion and is constructed of a vertical face with respect to a radial direction of the stem portion of the leg and is inclined in the peripheral direction of the stem portion of the leg with respect to a direction in which the stem portion of the leg is extended.

3. The electronic device as claimed in claim 2,
wherein the case thread ridge portion includes at least a first thread ridge portion, a second thread ridge portion, and a third thread ridge portion,
wherein each of the first thread ridge portion, the second thread ridge portion, and the third thread ridge portion is provided for each lap of the three laps of thread ridge and corresponds to a portion, which is smaller than one portion when a single lap of the thread ridge is divided into three equal portions, and is arranged in such a way that they do not overlap each other when viewed from a direction in which the leg is inserted into the hole.

4. The electronic device as claimed in claim 1,
wherein the second screw structure portion is arranged separately from the first screw structure portion in such a way that when the leg is inserted into the hole and the second screw structure portion passes through the case thread ridge portion, the case thread ridge portion is located between the first screw structure portion and the second screw structure portion.

5. The electronic device as claimed in claim 2, wherein the second screw structure portion is arranged separately from the first screw structure portion in such a way that when the leg is inserted into the hole and the second screw structure portion passes through the case thread ridge portion, the case thread ridge portion is located between the first screw structure portion and the second screw structure portion.

6. The electronic device as claimed in claim 3, wherein the second screw structure portion is arranged separately from the first screw structure portion in such a way that when the leg is inserted into the hole and the second screw structure portion passes through the case thread ridge portion, the case thread ridge portion is located between the first screw structure portion and the second screw structure portion.

* * * * *